(12) United States Patent
Lee et al.

(10) Patent No.: US 9,142,323 B1
(45) Date of Patent: Sep. 22, 2015

(54) HARDWARE ACCELERATION OF DSP ERROR RECOVERY FOR FLASH MEMORY

(75) Inventors: Meng-Kun Lee, Cupertino, CA (US); Kwok W. Yeung, Milpitas, CA (US)

(73) Assignee: SK hynix memory solutions inc., San Jose, CA (US)

(*) Notice: Subject to any disclaimer, the term of this patent is extended or adjusted under 35 U.S.C. 154(b) by 128 days.

(21) Appl. No.: 13/408,913

(22) Filed: Feb. 29, 2012

Related U.S. Application Data

(60) Provisional application No. 61/448,148, filed on Mar. 1, 2011.

(51) Int. Cl.
*G11C 29/00* (2006.01)
*G11C 29/42* (2006.01)
*G11C 5/14* (2006.01)

(52) U.S. Cl.
CPC ............... *G11C 29/42* (2013.01); *G11C 5/147* (2013.01)

(58) Field of Classification Search
CPC combination set(s) only.
See application file for complete search history.

(56) References Cited

U.S. PATENT DOCUMENTS

| | | | |
|---|---|---|---|
| 7,245,537 B2* | 7/2007 | Jeong | 365/185.22 |
| 2003/0012064 A1* | 1/2003 | Beretta | 365/200 |
| 2006/0087888 A1* | 4/2006 | Jeong | 365/185.28 |
| 2006/0233032 A1* | 10/2006 | Kanamori et al. | 365/200 |
| 2008/0316802 A1* | 12/2008 | Happ et al. | 365/163 |
| 2009/0024905 A1* | 1/2009 | Shalvi et al. | 714/773 |
| 2010/0020604 A1* | 1/2010 | Cornwell et al. | 365/185.03 |
| 2010/0254195 A1* | 10/2010 | Cho et al. | 365/185.24 |
| 2011/0038212 A1* | 2/2011 | Uchikawa et al. | 365/185.18 |
| 2011/0107161 A1* | 5/2011 | Eguchi et al. | 714/721 |
| 2011/0138254 A1* | 6/2011 | Yang | 714/773 |

OTHER PUBLICATIONS

Author: Anys Bacha, Radu Teodorescu; Title: Using ECC Feedback to Guide Voltage Speculation in Low-Voltage Processors; Publisher: 2014 IEEE.*

* cited by examiner

*Primary Examiner* — April Y Blair
*Assistant Examiner* — Thien D Nguyen
(74) *Attorney, Agent, or Firm* — Van Pelt, Yi & James LLP

(57) ABSTRACT

A method for correcting a cell voltage driftage in a NAND flash device is disclosed. An indicator indicating a cell voltage driftage in a memory unit of a NAND flash device is monitored by a processor. A cell voltage driftage in the NAND flash device is detected based at least in part on the indicator. One or more NAND commands correcting the cell voltage driftage are generated. The one or more NAND commands include a NAND command associated with changing a configuration setting of the NAND flash device.

25 Claims, 6 Drawing Sheets

HARDWARE ACCELERATION OF DSP ERROR RECOVERY FOR FLASH MEMORY

CROSS REFERENCE TO OTHER APPLICATIONS

This application claims priority to U.S. Provisional Patent Application No. 61/448,148 entitled HARDWARE ACCELERATION OF DSP ERROR RECOVERY FOR FLASH MEMORY filed Mar. 1, 2011 which is incorporated herein by reference for all purposes.

BACKGROUND OF THE INVENTION

In a storage media device system, data is typically read from NAND flash devices, and then the read data is processed by a decoder. For example, the decoder may be an error-correcting code (ECC) decoder enabling reconstruction of the original error-free data. Data retention is the ability of a memory bit to retain its data state over long periods of time. The data retention of NAND flash devices may be limited by charge leaking from the floating gates of the memory cell transistors. Furthermore, leakage is accelerated by high temperature or radiation. Program-erase cycles (P/E cycles) can also degrade a NAND flash device. Therefore, improved techniques that address the above problems in NAND flash devices would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

In various embodiments, the techniques described herein are implemented in a variety of systems or forms. In some embodiments, the techniques are implemented in hardware as an application-specific integrated circuit (ASIC) or a field-programmable gate array (FPGA). In some embodiments, a processor (e.g., an embedded one such as an ARM core) is used where the processor is provided or loaded with instructions to perform the techniques described herein. In some embodiments, the technique is implemented as a computer program product which is embodied in a computer readable storage medium and comprises computer instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
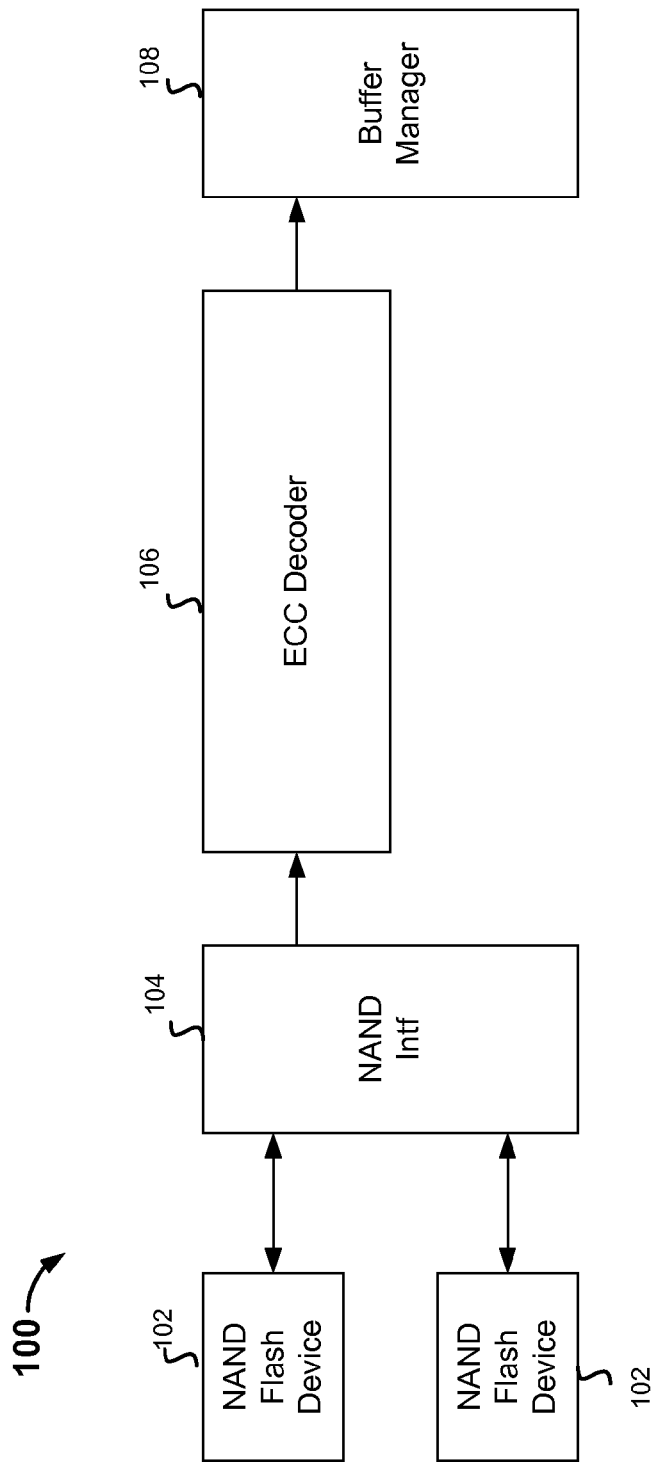
FIG. 1 is a block diagram illustrating an embodiment of a storage media device system 100.

FIG. 1 is a block diagram illustrating an embodiment of a storage media device system 100. Storage media device system 100 includes one or more non-volatile computer storage chips 102, such as NAND flash devices 102. In the present patent application, NAND flash devices are selected as illustrative examples only. The techniques disclosed herein may apply to other computer storage chips as well; accordingly, the present application is not limited to the specific example of NAND flash devices only.

With continued reference to FIG. 1, storage media device system 100 also includes a computer storage chip interface 104, such as a NAND flash interface 104, which provides an interface to NAND flash devices 102. For example, NAND flash interface 104 provides an interface for NAND flash devices 102 to identify themselves and describe their capabilities. It also provides an interface for storage media device system 100 to perform commands, including reading, programming, erasing, and register changes on NAND flash devices 102. When storage media device system 100 sends a read command via NAND flash interface 104 to one of the NAND flash devices 102, the NAND flash device will send the read data to NAND flash interface 104, and NAND flash interface 104 will in turn send the read data to a decoder 106. For example, decoder 106 is an error-correcting code (ECC) decoder enabling reconstruction of the original error-free data initially stored in the NAND flash device. The decoded data from ECC decoder 106 is then sent to a buffer manager 108, such as a DDR SRAM (double data rate static random-access memory). In some embodiments, ECC decoder 106 is a BCH decoder. In some embodiments, ECC decoder 106 is a low-density parity-check (LDPC) decoder. In various embodiments, LDPC decoder 106 may be implemented using various algorithms, including the sum-product algorithm, min-sum algorithm, and brief propagation algorithm.

The cell voltage level ($V_t$) of a NAND flash device can decay or otherwise leak under certain circumstances. For example, after data is programmed onto a NAND flash device, the cell voltage levels slowly drift down after a period of time, typically after months or years, because charge may slowly leak from the floating gates of the memory cell transistors. Furthermore, the speed of such voltage driftage is accelerated by keeping the NAND flash device in a high temperature environment for long hours or if many program-erase cycles have been performed on the NAND flash device.

Figure 2A:
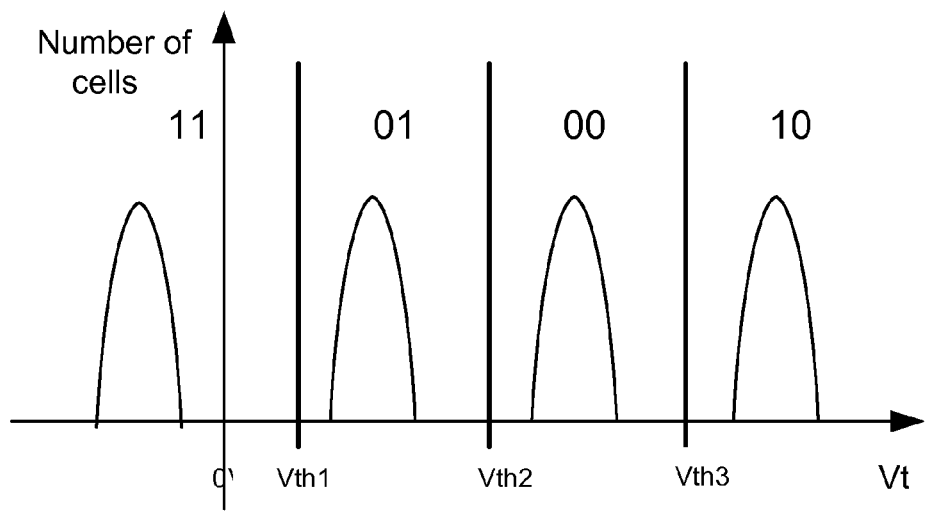
FIG. 2A is a diagram illustrating the cell voltage level ($V_t$) distribution of a NAND flash device immediately after the NAND flash device has been programmed.

FIG. 2A is a diagram illustrating an embodiment of a cell voltage level ($V_t$) distribution of a NAND flash device immediately after the NAND flash device has been programmed. As shown in the figure, the NAND flash device under test is a multi-level cell (MLC) NAND flash device storing two bits per cell, or having four possible states per cell, i.e., 11, 01, 00, and 10. As shown in FIG. 2A, the cell voltage level distribution corresponding to the four possible states immediately after programming do not overlap with each other. Therefore, the NAND flash device may differentiate the four possible states in a cell by comparing the cell voltage against three read threshold values, i.e., $V_{th1}$, $V_{th2}$, and $V_{th3}$, which are programmable by the storage media device system by issuing read threshold register changes to the NAND flash device.

Figure 2B:
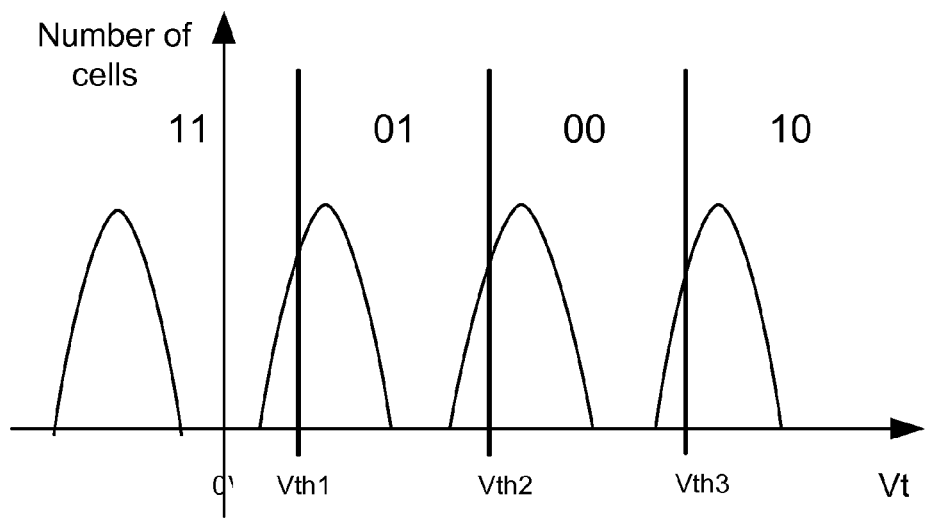
FIG. 2B is a diagram illustrating the cell voltage level ($V_t$) distribution of the NAND flash device in FIG. 2A after the NAND flash device has been baked in high temperature for two hours.

FIG. 2B is a diagram illustrating the cell voltage level ($V_t$) distribution of the NAND flash device in FIG. 2A after the NAND flash device has been baked in high temperature for two hours. As shown in the figure, the downward driftage of the cell voltage levels caused by the high temperature baking may cause the NAND flash device to incorrectly detect the states of some of the cells. For example, as shown in the figure, some of the cells that originally belong to state "10" now have a cell voltage that is below $V_{th3}$ and therefore are being detected as state "00" instead. If the cell voltage levels continue to drift downwards, the amount of detection errors may become so great that the errors are no longer correctable by an ECC decoder (e.g., 106 in FIG. 1). In order to better differentiate the different states from each other, the three read threshold values can be adjusted by issuing read threshold register changes to the NAND flash device, as will be described in greater detail below.

Figure 3:
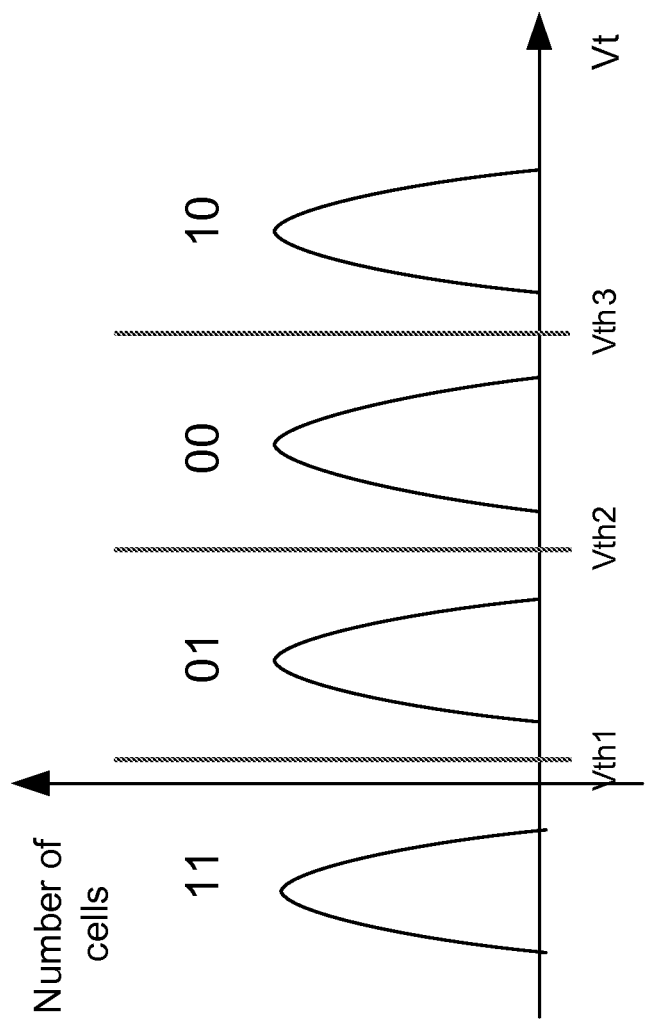
FIG. 3 is a diagram illustrating that, in response to the download driftage of the cell voltage levels in FIG. 2B, adjustment to the read threshold values of the NAND flash device can be made to better partition the four possible states of the cells.

FIG. 3 is a diagram illustrating that, in response to the downward driftage of the cell voltage levels in FIG. 2B, an embodiment of an adjustment to the read threshold values of the NAND flash device can be made to better partition the four possible states of the cells. As shown in the figure, each of the read threshold values is adjusted downwards such that the cell voltages corresponding to each state can be differentiated by the read threshold values. For example, the cell voltages corresponding to state "10" lie above $V_{th3}$, the cell voltages corresponding to state "00" lie between $V_{th2}$ and $V_{th3}$, and so forth.

In some techniques, a plurality of iterations may be made to dynamically find the optimal read threshold values after an ECC decoder begins to fail to reconstruct the read data. This technique may not be optimal for a number of reasons. An ECC decoder may fail to decode a set of data due to reasons other than driftage of the cell voltage levels in the NAND flash devices. For instance, the ECC decoder may fail to decode a set of data due to other defects in one or more of the NAND flash devices. In this case, if the storage media device system initiates an error recovery at this time, the system will needlessly go through many iterations to search for an optimal set of read threshold values, wasting time and computation power of the system. For example, if there are 32 settings for each of the three read threshold values, then as many as $32^3$ iterations may need to be performed, e.g., by a piece of firmware code. Furthermore, failure by an ECC decoder in decoding a set of data may not be a suitable trigger for initiating an error recovery of the NAND flash devices. In some cases, a faster error recovery of the NAND flash devices may be achievable if the error recovery is initiated earlier, i.e., before the ECC decoder begins to fail to decode a set of data. The error recovery may be faster because the cell voltage levels have not drifted too far away from their original values, and therefore it may take fewer iterations to locate the optimal read threshold values.

Figure 4:
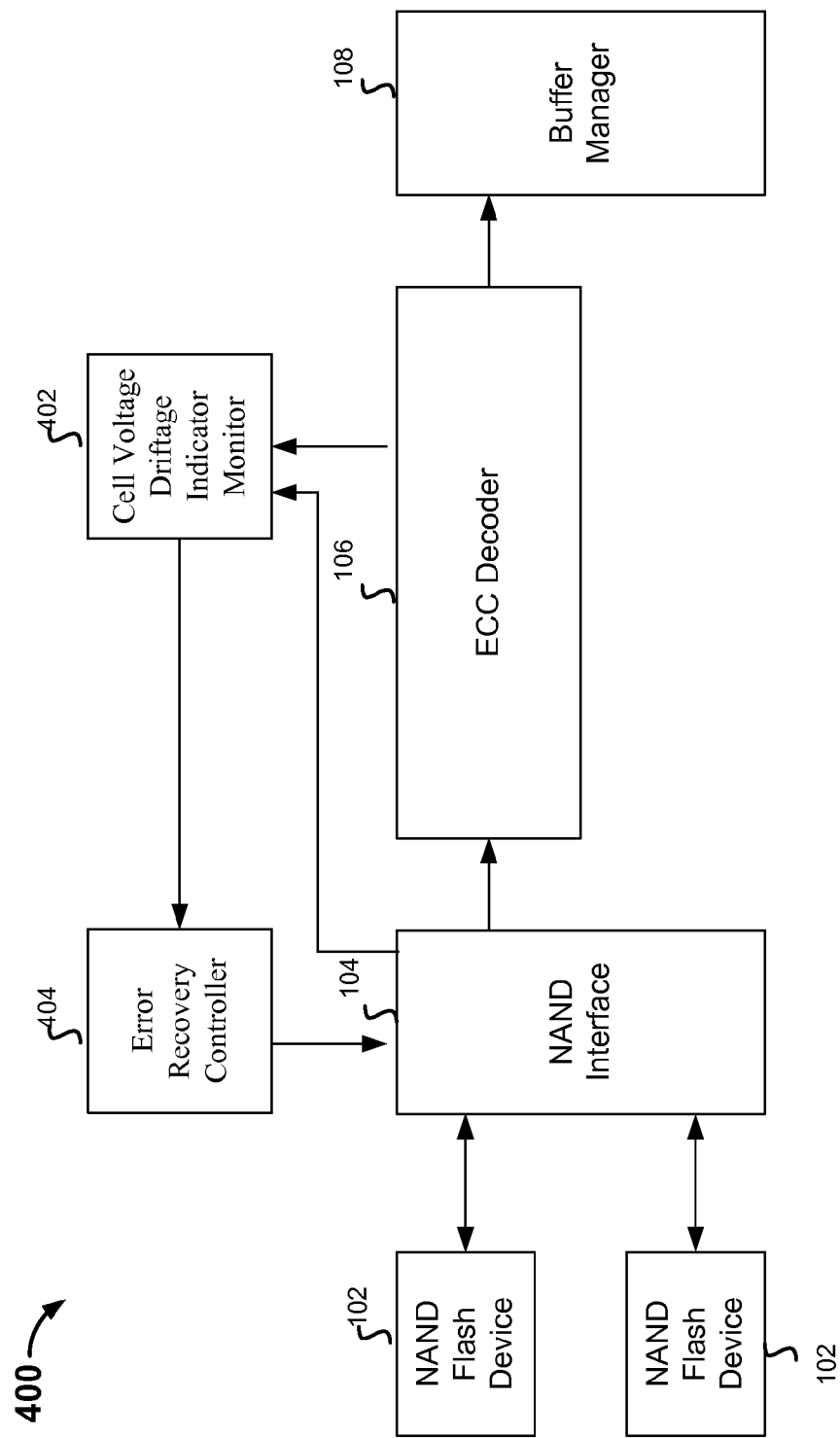
FIG. 4 is a block diagram illustrating an embodiment of a storage media device system 400.

FIG. 4 is a block diagram illustrating an embodiment of a storage media device system 400. As shown in FIG. 4, a cell voltage driftage indicator monitor 402 and an error recovery controller 404 are included in storage media device system 400 for NAND flash device fast error recovery, as will be described in greater detail below. In some embodiments, cell voltage driftage indicator monitor 402 and error recovery controller 404 are implemented as hardware blocks for faster processing and to allow access of information that is otherwise not readily available in firmware or software.

Cell voltage driftage indicator monitor 402 monitors, collects, and outputs different types of information that may help storage media device system 400 to determine earlier on and more reliably whether the cell voltage levels of any of the NAND flash devices 102 have drifted. For example, any information about the types of error, any information that indicates certain error patterns of the read data, or any information that indicates how difficult or how easy it is for ECC decoder 106 to correct the read data can be used alone or in combination with other information.

In some embodiments, the indicators or information monitored and collected by cell voltage driftage indicator monitor 402 include results generated by ECC decoder 106. For example, intermediate results of ECC decoder 106 may be monitored by and collected by cell voltage driftage indicator monitor 402. These intermediate results include the number of ECC errors (i.e., the number of errors before error-correction), the number of LDPC iterations, and the like.

In some embodiments, the information monitored and collected by cell voltage driftage indicator monitor 402 includes operation data related to the one or more NAND flash devices 102. For example, cell voltage driftage indicator monitor 402 may monitor and collect the status or statistical information of the one or more NAND flash devices 102, including the program and erase time, data distribution information, such as the number of one and zero bits in the data content stored on the one or more NAND flash devices 102, and the like.

This figure shows an embodiment of a system where correction of a system in response to voltage driftage occurs in hardware and/or is built-in to the system being corrected. This architecture may be attractive for a number of reasons. For example, since the correction mechanism is built-in, firmware or other software does not need to include such correction logic and correction can be performed automatically and/or with the direction of firmware or other software. This may free up processing resources and/or reduce the amount of traffic exchanged between the hardware and the software (e.g., because commands and data related to detecting and/or correcting cell voltage driftage no longer need to be exchanged on that hardware/software interface). Another advantage is that it may be faster since hardware may be able to detect and/or correct for cell voltage driftage sooner than firmware or other software. Another advantage is that detection and/or correction using this technique may be better (i.e., a performance increase) since cell voltage driftage indicator monitor 402 may have access to more information than the firmware or other software. Although it is possible to provide firmware or software access to the same information as cell voltage driftage indicator monitor 402, it may not necessarily be feasible, for example because of bandwidth constraints (e.g., would consume too much bandwidth for overhead) and/or interface constraints (e.g., the data has many digits and in light of the number of input/output pins a semiconductor has, it may take more cycles than is desirable to exchange the data).

Figure 5:
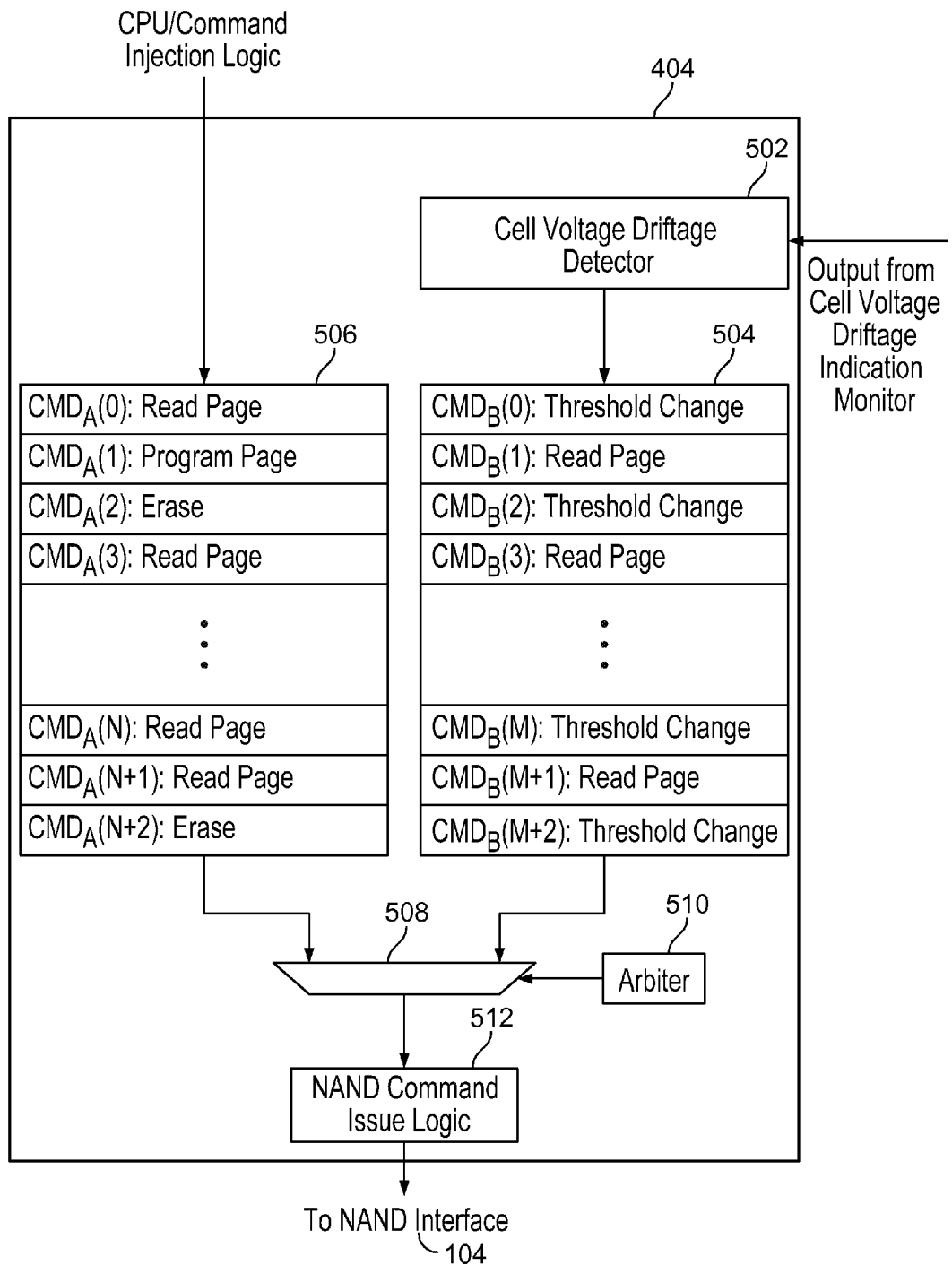
FIG. 5 is a block diagram illustrating an embodiment of error recovery controller 404.

FIG. 5 is a block diagram illustrating an embodiment of error recovery controller 404. As shown in the figure, this embodiment of error recovery controller 404 includes a cell voltage driftage detector 502. Cell voltage driftage detector 502 detects a cell voltage driftage in the one or more of the NAND flash devices 102 based at least in part on the output from cell voltage driftage indicator monitor 402. For example, a cell voltage driftage may be detected in a particular memory unit, such as a particular page, or a particular die. Cell voltage driftage detector 502 further generates a plurality of NAND commands to be sent to NAND interface 104 for the error recovery of the NAND flash devices 102.

Figure 6:
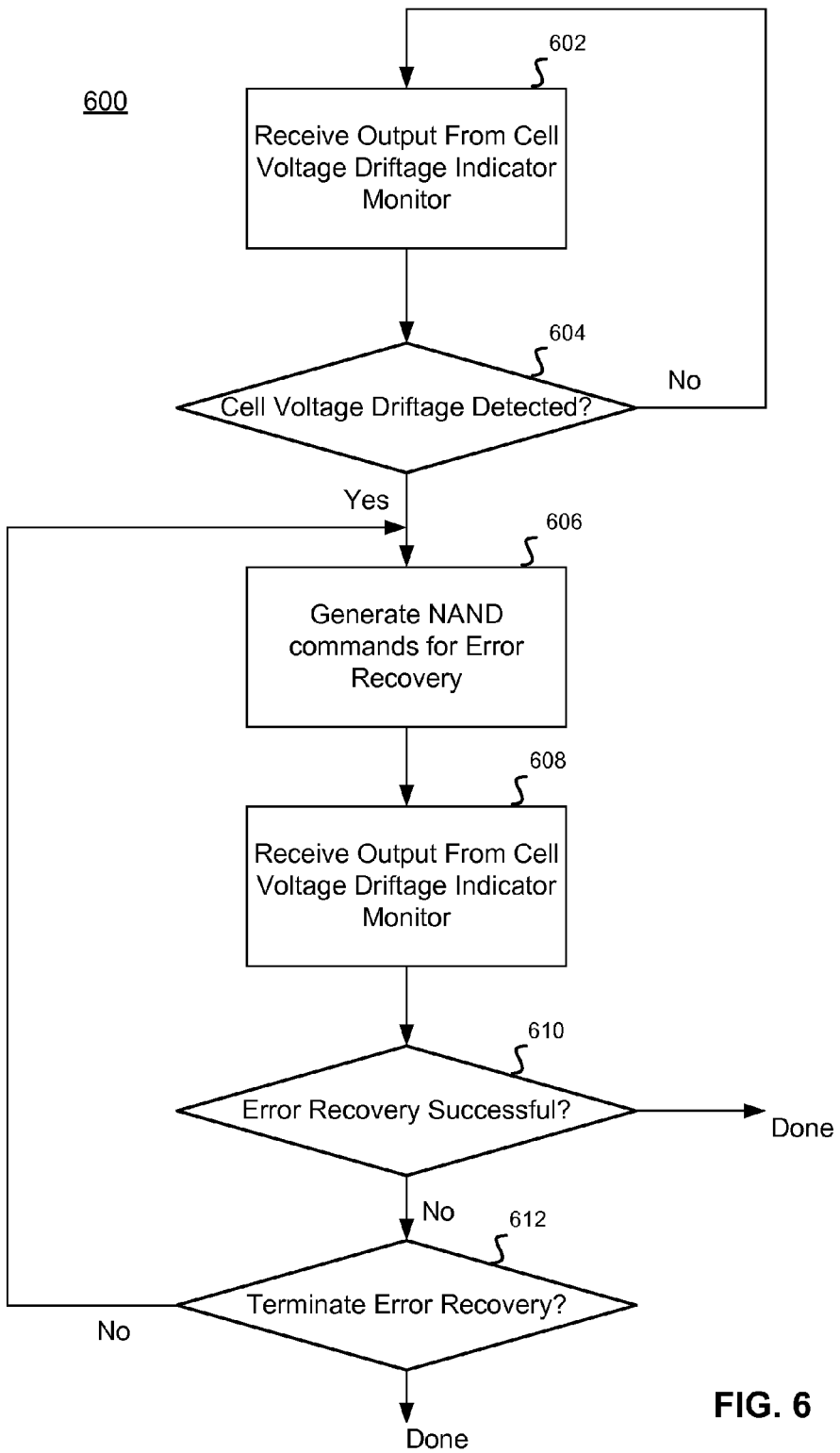
FIG. 6 is a flow diagram illustrating an embodiment of a process 600 for cell voltage driftage detector 502.

FIG. 6 is a flow diagram illustrating an embodiment of a process 600 for cell voltage driftage detector 502. In some embodiments, a cell voltage driftage detector performs some processes other than the exemplary one shown. At 602, the output from cell voltage driftage indicator monitor 402 is received by cell voltage driftage detector 502. As described above, the output includes different types of information that may help cell voltage driftage detector 502 to determine earlier on and more reliably whether the cell voltage levels of any of the NAND flash devices 102 have drifted or has drifted beyond a certain predetermined threshold. The output from cell voltage driftage indicator monitor 402 may also be used by cell voltage driftage detector 502 to determine how to adjust the read threshold register values.

At 604, cell voltage driftage detector 502 determines whether the cell voltage levels of any of the NAND flash devices 102 have drifted based at least in part on the information collected and sent by cell voltage driftage indicator monitor 402. A few examples of how the information may be used to determine cell voltage driftage are disclosed herein as illustrative examples only; the technique is not limited to the examples described herein. For example, any information about the types of error, any information that indicates certain error patterns of the read data, or any information that indicates how difficult or how easy it is for ECC decoder 106 to correct the read data can be used alone or in combination with other information to determine cell voltage driftage.

In some embodiments, the number of ECC errors may be used to determine the quality of a memory unit (e.g., a page) in one of the NAND flash devices 102. For example, decoder 106 may be a BCH ECC decoder, and the ECC capability of the BCH ECC decoder may be N bits (e.g., 100 bits). When a page with M errors (where M is <N) has been detected, then cell voltage driftage detector 502 may determine that cell voltage driftage has been detected in that page and appropriate action may be taken (e.g., reducing one or more read threshold values).

In some embodiments, the number of LDPC iterations may be used to determine the quality of a memory unit (e.g., a page) in one of the NAND flash devices 102. For example, decoder 106 may be a LDPC decoder, and the maximum number of LDPC iterations may be N. When the number of iterations taken is beyond a certain predetermined threshold, then cell voltage driftage detector 502 may determine that cell voltage driftage has been detected in that memory unit.

In some embodiments, data distribution, such as the number of one and zero-bits in the data content stored in the one or more NAND flash devices 102, may be used to determine the quality of a memory unit, e.g., a page, in one of the NAND flash devices 102. The data stored in a page is typically fairly random; therefore, the number of one-bits and zero-bits in the page do not differ by too much. For example, for a MLC NAND flash device, the number of cells in each of the four possible states: 11, 01, 00, and 10, should be about the same. When the number of cells that are in a particular state exceeds or falls below a certain predetermined threshold (e.g., approximately 25% in the 2-bit example above), cell voltage driftage detector 502 may determine that cell voltage driftage has been detected in the page or memory unit.

With continued reference to FIG. 6, if cell voltage driftage is not detected at 604, then cell voltage driftage detector 502 may continue to receive output from cell voltage driftage indicator monitor 402 at 602 again. If cell voltage driftage is detected at 604, then cell voltage driftage detector 502 may initiate an error recovery for one or more of the NAND flash devices 102 at 606.

At 606, cell voltage driftage detector 502 further generates a plurality of NAND commands to be sent to NAND interface 104 for the error recovery of the NAND flash devices 102. In various embodiments, NAND commands generated at 606 are related to changing a configuration setting associated with a NAND Flash device. For example, cell voltage driftage detector 502 may generate one or more read threshold register change commands to correct the cell voltage driftage, followed by one or more read-page commands to re-read the page(s) again. In some embodiments, the generated NAND commands are put into a queue or a buffer storage 504, as shown in FIG. 5. The NAND commands in buffer storage 504 will subsequently be sent to NAND interface 104. In some embodiments, the generation of the one or more read threshold register change commands and the one or more read-page commands are based at least in part on the output from cell voltage driftage indicator monitor 402. For example, the read threshold values may need to be corrected by a greater amount if the output indicates that the cell voltage has drifted beyond a certain predetermined threshold.

At 608, after the page(s) is re-read, the output from cell voltage driftage indicator monitor 402 is received by the cell voltage driftage detector 502 again. If cell voltage driftage detector 502 determines that the amount of cell voltage driftage with the current read threshold values has been reduced or increased, then cell voltage driftage detector 502 may generate another set of NAND commands at 606 again accordingly for error recovery. Error recovery continues when cell voltage driftage detector 502 iterates and repeats through steps 606 to 612 as shown in FIG. 6, until one of the exit conditions has been met. Process 600 may terminate after cell voltage driftage detector 502 determines that the error recovery is successful at 610. In some embodiments, such determination is based at least in part on the output from cell voltage driftage indicator monitor 402. In some embodiments, the error recovery is determined as successful if a previously undecodable page is now decodable after adjustments are made (e.g., to the read threshold values). Process 600 may also terminate after 612 if one or more terminating conditions have been met. For example, if all the possible combinations of read threshold values have been exhausted, then the error recovery should terminate.

Referring back to FIG. 5, in some embodiments, the NAND commands generated by cell voltage driftage detector 502 are put into buffer storage 504. In some embodiments, buffer storage 504 is a FIFO (first-in, first, out) buffer. However, other buffer structures may be used as well. As shown in FIG. 5, buffer storage 504 includes M+3 NAND commands for error recovery. In some embodiments, multiple pages in different dies may need to go through error recovery; therefore, the multiple sets of read threshold register changes and read-page commands may be targeted to more than one page or one die.

With continued reference to FIG. 5, error recovery controller 404 receives the regular NAND commands from CPU/Command Injection Logic. In some embodiments, these regular NAND commands, i.e., NAND commands not related to error recovery, are generated by the CPU or other controllers of storage media device system 400. In some embodiments, the regular NAND commands are stored in a buffer storage 506 as shown in FIG. 5. For example, the commands can be stored in a FIFO buffer. As shown in the figure, buffer storage 506 includes N+3 regular NAND commands, including commands for reading, programming, erasing, and the like. Note that these N+3 regular NAND commands may be targeted to more than one memory unit, e.g., a page, or more than one die.

An arbiter block 510 determines the order in which the NAND commands in buffer storage 504 and buffer storage 506 are sent to a NAND command issue logic block 512. In some embodiments, arbiter block 510 selects NAND commands from buffer storage 504 and buffer storage 506 to be sent to NAND command issue logic block 512 such that optimal error recovery can be achieved, while reducing the impact to the timely execution of the regular NAND commands. Different scheduling schemes may be used. In some embodiments, a weighted round-robin scheme between buffer storage 504 and buffer storage 506 may be used. For example, arbiter block 510 may select buffer storage 506 N times before it selects buffer storage 504 once. In some embodiments, arbiter block 510 selects the NAND commands from both buffer storages such that the NAND commands for error recovery are properly processed and that the re-read pages can be decoded within a predetermined amount of time, while processing the regular NAND commands within the constraints imposed by different requirements. For example, for Serial Advanced Technology Attachment (SATA) applications, the time-out for a read-page command is five seconds. For some applications, the maximum time-out for a read-page command can be as short as 5 ms.

With continued reference to FIG. 5, NAND command issue logic 512 receives NAND commands that are selected by Arbiter block 510. NAND command issue logic 512 then generates traffic based on the NAND interface protocol. For example, a read-page command may be sent according to a protocol for the ONFI (Open NAND Flash Interface).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for correcting a cell voltage driftage in a NAND flash device, comprising:
    using a cell voltage driftage detector to monitor an indicator indicating a cell voltage driftage in a memory unit of a NAND flash device, wherein monitoring the indicator includes monitoring intermediate results of an error-correcting code (ECC) decoder decoding data stored in the memory unit of the NAND flash device, wherein the ECC decoder comprises a low-density parity-check (LDPC) decoder, and wherein monitoring the intermediate results of the LDPC decoder comprises monitoring a number of LDPC iterations of the LDPC decoder;
    using the cell voltage driftage detector to detect a cell voltage driftage in the NAND flash device based at least in part on the indicator, comprising detecting a cell voltage driftage in the NAND flash device in response to detecting the number of LDPC iterations is greater than a predetermined threshold for the number of LDPC iterations; and
    in response to detecting the cell voltage driftage, generating one or more NAND commands correcting the cell voltage driftage, including by generating a NAND command associated with changing a configuration setting of the NAND flash device.

2. The method of claim 1, wherein detecting comprises detecting the cell voltage driftage prior to the error-correcting code (ECC) decoder decoding data stored in the memory unit of the NAND flash device fails to decode the data.

3. The method of claim 1, wherein the intermediate results comprise a number of errors before error-correction.

4. The method of claim 1, wherein monitoring the indicator includes monitoring operation data corresponding to the NAND flash device.

5. The method of claim 4, wherein the operation data comprises status data of the NAND flash device.

6. The method of claim 4, wherein the operation data comprises statistical information of the NAND flash device.

7. The method of claim 4, wherein the operation data comprises a number of one-bits and a number of zero-bits in data stored in the memory unit.

8. The method of claim 1, wherein the one or more NAND commands comprise one or more read threshold register value change commands.

9. The method of claim 1, further comprising generating one or more NAND read commands.

10. The method of claim 9, further comprising monitoring the indicator after the generation of the one or more NAND read commands.

11. The method of claim 1, further comprising scheduling an order in which the one or more NAND commands correcting the cell voltage driftage and one or more NAND commands not related to correcting the cell voltage driftage are sent to an NAND interface.

12. The method of claim 1, wherein the cell voltage driftage detector comprises hardware blocks without assistance from software or firmware.

13. A system for correcting a cell voltage driftage in a NAND flash device, comprising:
    a cell voltage driftage indicator monitor receiving an indicator indicating a cell voltage driftage in a memory unit of a NAND flash device, wherein the indicator includes intermediate results of an error-correcting code (ECC) decoder decoding data stored in the memory unit of the NAND flash device, wherein the ECC decoder comprises a low-density parity-check (LDPC) decoder, and wherein the intermediate results of the LDPC decoder comprises a number of LDPC iterations of the LDPC decoder; and
    a cell voltage driftage detector coupled to the cell voltage driftage indication monitor, configured to:
    monitor the indicator;
    detect a cell voltage driftage in the NAND flash device based at least in part on the indicator, comprising detecting a cell voltage driftage in the NAND flash device in response to detecting the number of LDPC iterations is greater than a predetermined threshold for the number of LDPC iterations; and in response to detecting the cell voltage driftage, generate one or more NAND commands correcting the cell voltage driftage, wherein generating includes generating a NAND command associated with changing a configuration setting of the NAND flash device.

14. The system of claim 13, wherein detecting comprises detecting the cell voltage driftage prior to the error-correcting code (ECC) decoder decoding data stored in the memory unit of the NAND flash device fails to decode the data.

15. The system of claim 13, wherein the intermediate results comprise a number of errors before error-correction.

16. The system of claim 13, wherein the indicator includes operation data corresponding to the NAND flash device.

17. The system of claim 16, wherein the operation data comprises status data of the NAND flash device.

18. The system of claim 16, wherein the operation data comprises statistical information of the NAND flash device.

19. The system of claim 16, wherein the operation data comprises a number of one-bits and a number of zero-bits in data stored in the memory unit.

20. The system of claim 13, wherein the one or more NAND commands comprise one or more read threshold register value change commands.

21. The system of claim 13, wherein the cell voltage driftage detector is further configured to generate one or more NAND read commands.

22. The system of claim 21, wherein the cell voltage driftage detector is further configured to monitor the indicator after the generation of the one or more NAND read commands.

23. The system of claim 13, wherein the cell voltage driftage detector is further configured to schedule an order in which the one or more NAND commands correcting the cell voltage driftage and one or more NAND commands not related to correcting the cell voltage driftage are sent to an NAND interface.

24. The system of claim 13, wherein the cell voltage driftage detector comprises hardware blocks without assistance from software or firmware.

25. A computer program product for correcting a cell voltage driftage in a NAND flash device, the computer program product being embodied in a non-transitory computer readable storage medium and comprising computer instructions for:

monitoring an indicator indicating a cell voltage driftage in a memory unit of a NAND flash device, wherein monitoring the indicator includes monitoring intermediate results of an error-correcting code (ECC) decoder decoding data stored in the memory unit of the NAND flash device, wherein the ECC decoder comprises a low-density parity-check (LDPC) decoder, and wherein monitoring the intermediate results of the LDPC decoder comprises monitoring a number of LDPC iterations of the LDPC decoder;

detecting a cell voltage driftage in the NAND flash device based at least in part on the indicator, comprising detecting a cell voltage driftage in the NAND flash device in response to detecting the number of LDPC iterations is greater than a predetermined threshold for the number of LDPC iterations; and in response to detecting the cell voltage driftage, generating one or more NAND commands correcting the cell voltage driftage, including by generating a NAND command associated with changing a configuration setting of the NAND flash device.

* * * * *